(12) United States Patent
Kim et al.

(10) Patent No.: US 8,946,762 B2
(45) Date of Patent: Feb. 3, 2015

(54) LIGHT EMITTING DIODE AND LIGHT EMITTING DIODE PACKAGE

(71) Applicants: Electronics and Telecommunications Research Institute, Daejeon (KR); Industry-University Cooperation Foundation Hanyang Univ., Gyeonggi-do (KR)

(72) Inventors: Jongbae Kim, Daejeon (KR); Jong-In Shim, Seoul (KR); Hyunsung Kim, Seoul (KR); Il-Gyun Choi, Gyeonggi-do (KR)

(73) Assignees: Electronics and Telecommunications Research Institute, Daejeon (KR); Industry-University Cooperation Foundation Hanyang Univ., Gyeonggi-Do (KR)

( * ) Notice: Subject to any disclaimer, the term of this patent is extended or adjusted under 35 U.S.C. 154(b) by 0 days.

(21) Appl. No.: 13/970,825

(22) Filed: Aug. 20, 2013

(65) Prior Publication Data

US 2014/0048840 A1    Feb. 20, 2014

(30) Foreign Application Priority Data

Aug. 20, 2012  (KR) .................. 10-2012-0090859
Jan. 30, 2013   (KR) .................. 10-2013-0010433

(51) Int. Cl.
*H01L 33/00*   (2010.01)
*H01L 33/62*   (2010.01)
H01L 33/38      (2010.01)
*H01L 33/20*   (2010.01)

(52) U.S. Cl.
CPC .............. *H01L 33/62* (2013.01); *H01L 33/38* (2013.01); *H01L 2224/16* (2013.01); *H01L 33/20* (2013.01)

USPC .................... 257/99; 257/94; 257/79; 257/91

(58) Field of Classification Search
USPC ............ 257/79–103, 745, 773, 775, E23.141, 257/E33.072; 438/22, 597, 604, 606
See application file for complete search history.

(56) References Cited

U.S. PATENT DOCUMENTS 7,259,447 B2    8/2007  Kong et al.
(Continued)

FOREIGN PATENT DOCUMENTS

| KR | 10-0512361 B1 | 9/2005 |
| KR | 10-0631967 B1 | 10/2006 |
| KR | 10-2009-0032774 A | 4/2009 |

OTHER PUBLICATIONS

Shanjin Huang et al., "A chip-level electrothermal-coupled design model for high-power light-emitting diodes", Journal of Applied Physics, Mar. 3, 2010, pp. 054509-1~054509-8, vol. 107, Issue 5.
(Continued)

*Primary Examiner* — Matthew Reames
*Assistant Examiner* — Vincent Wall
(74) *Attorney, Agent, or Firm* — Rabin & Berdo, P.C.

(57) ABSTRACT

A light emitting diode includes a first semiconductor layer, an active layer, and a second semiconductor layer sequentially stacked on a substrate, and a first electrode connected to the first semiconductor layer. The first electrode includes an edge electrode including first and second edge portions opposite to each other, and a line electrode including first and second line portions respectively extending from the first and second edge portions. The edge electrode has a closed loop-shape. A distance between the first line portion and the second edge portion is equal to or less than a quarter of a length of the first line portion. A distance between the second line portion and the first edge portion is equal to or less than a quarter of a length of the second line portion.

10 Claims, 4 Drawing Sheets

(56) References Cited

U.S. PATENT DOCUMENTS

| | | | |
|---|---|---|---|
| 7,642,183 B2* | 1/2010 | Zhao et al. | 438/609 |
| 2006/0192206 A1* | 8/2006 | Kong et al. | 257/79 |
| 2007/0085095 A1* | 4/2007 | Ko et al. | 257/94 |

OTHER PUBLICATIONS

Wataru Ochiai et al., "Optimization of electrode configuration in large GaInN light-emitting diodes", Physica Status Solidi C, Jun. 2009, pp. 1416-1419, vol. 6, No. 6.

* cited by examiner

LIGHT EMITTING DIODE AND LIGHT EMITTING DIODE PACKAGE

CROSS-REFERENCE TO RELATED APPLICATIONS

This U.S. non-provisional patent application claims priority under 35 U.S.C. §119 to Korean Patent Application Nos. 10-2012-0090859 and 10-2013-0010433, filed on Aug. 20, 2012 and Jan. 30, 2013, the entirety of which is incorporated by reference herein.

BACKGROUND

The inventive concept relates to light emitting diodes and light emitting diode packages and, more particularly, to light emitting diodes capable of improving a current diffusion characteristic and light emitting diode packages including the same.

A light emitting diode (LED) is a type of P-N junction diode. The light emitting diode is a semiconductor device using an electroluminescence that monochromatic light is emitted when a forward bias is applied thereto. A wavelength of the light emitted from the light emitting diode may be determined depending on bandgap energy (Eg) of a material used for the light emitting diode. Light emitting diodes emitting infrared rays and a red light were mainly developed in the initial stages of light emitting diode techniques. In 1993, Nakamura of Nichia chemical industries discovered that a blue light was generated using gallium nitride (GaN). After that, blue light emitting diodes have been developed. A white color is made by mixing a red color, a green color, and blue color. Thus, the blue light emitting diode based on the gallium nitride (GaN) and previously developed red and green light emitting diode may enable a white light emitting diode to be realized.

Meanwhile, light-emitting efficiency and a lifetime of light emitting diode should be improved for increasing marketability thereof. However, in the blue light emitting diode based on the gallium nitride, light generated in an active layer may be partially outputted from the blue light emitting diode by difference between refractive indexes of the gallium nitride and air, and the generated light may be mostly re-absorbed in the blue light emitting diode to become extinct. Thus, almost of blue light emitting diodes have low light-emitting efficiencies of about 4%. Recently, various techniques are suggested for increasing the light-emitting efficiency.

SUMMARY

Embodiments of the inventive concept may provide light emitting diodes having improved current diffusion characteristics and light emitting diode packages including the same.

In one aspect, a light emitting diode may include: a substrate; a first semiconductor layer, an active layer, and a second semiconductor layer sequentially stacked on the substrate; and a first electrode connected to the first semiconductor layer. The first electrode may include: an edge electrode including a first edge portion and a second edge portion opposite to each other, the edge electrode having a closed loop-shape extending along an edge of the first semiconductor layer; and a line electrode including a first line portion extending from the first edge portion and a second line portion extending the second edge portion. A distance between the first line portion and the second edge portion may be equal to or less than a quarter of a length of the first line portion; and a distance between the second line portion and the first edge portion may be equal to or less than a quarter of a length of the second line portion.

In an embodiment, the first line portion may be parallel to the second line portion.

In an embodiment, the edge electrode may further include a third edge portion and a fourth edge portion that connect the first edge portion to the second edge portion; and the third edge portion may be parallel to the fourth edge portion.

In an embodiment, the first and second line portions may be parallel to the third and fourth edge portions.

In an embodiment, a distance between the first line portion and the third edge portion may be substantially equal to a distance between the first line portion and the fourth edge portion; and a width of the first line portion may be greater than widths of the second line portion and the edge electrode.

In an embodiment, at least one of the first line portion and the second line portion may be provided in a plural number.

In an embodiment, the first line portion may include a plurality of first line portions; the second line portion may include a plurality of second line portions; and the plurality of first line portions and the plurality of second line portions may be alternately arranged.

In an embodiment, the line electrode may include a pad portion adjacent to the edge electrode.

In an embodiment, the light emitting diode may further include: a second electrode connected to the second semiconductor layer.

In another aspect, a light emitting diode package may include: a package substrate; a second semiconductor layer, an active layer, a first semiconductor layer, and a transparent substrate sequentially stacked on the package substrate; a first electrode connected to the first semiconductor layer; a second electrode connected to the second semiconductor layer; and bumps connecting the first and second electrodes to the package substrate. The first electrode may include: an edge electrode including a first edge portion and a second edge portion opposite to each other, the edge electrode having a closed loop-shape extending along an edge of the first semiconductor layer; and a line electrode including a first line portion extending from the first edge portion and a second line portion extending the second edge portion. A distance between the first line portion and the second edge portion may be equal to or less than a quarter of a length of the first line portion; and a distance between the second line portion and the first edge portion may be equal to or less than a quarter of a length of the second line portion.

In an embodiment, the first line portion may be parallel to the second line portion.

In an embodiment, the edge electrode may further include: a third edge portion and a fourth edge portion that connect the first edge portion to the second edge portion; and the third edge portion may be parallel to the fourth edge portion.

In an embodiment, a distance between the first line portion and the third edge portion may be substantially equal to a distance between the first line portion and the fourth edge portion; and a width of the first line portion may be greater than widths of the second line portion and the edge electrode.

In an embodiment, the first line portion may include a plurality of first line portions; the second line portion may include a plurality of second line portions; and the plurality of first line portions and the plurality of second line portions may be alternately arranged.

In an embodiment, the line electrode may include a pad portion adjacent to the edge electrode.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
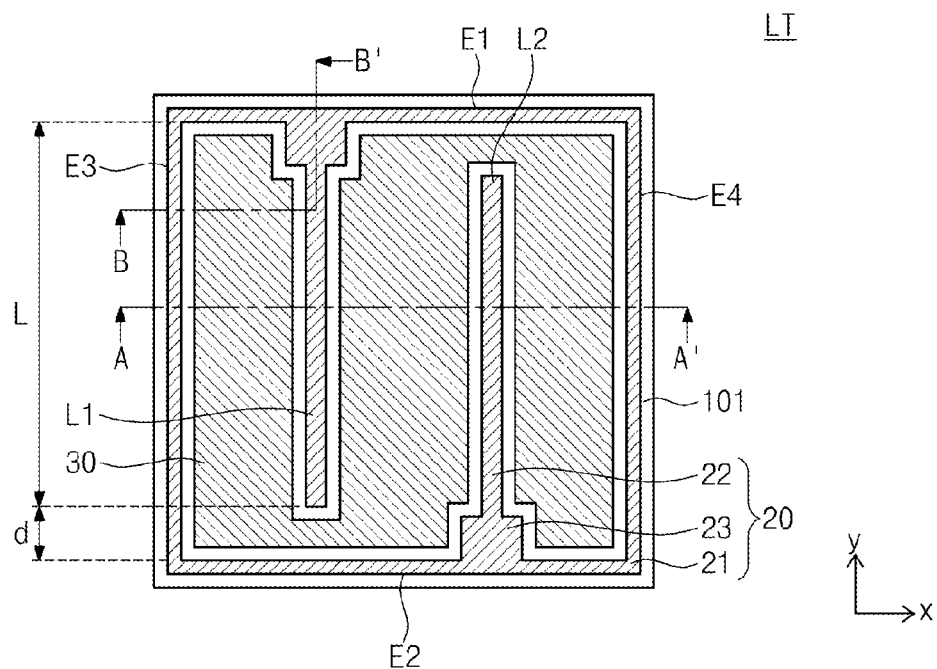
FIG. 1 is a plan view illustrating a light emitting diode according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
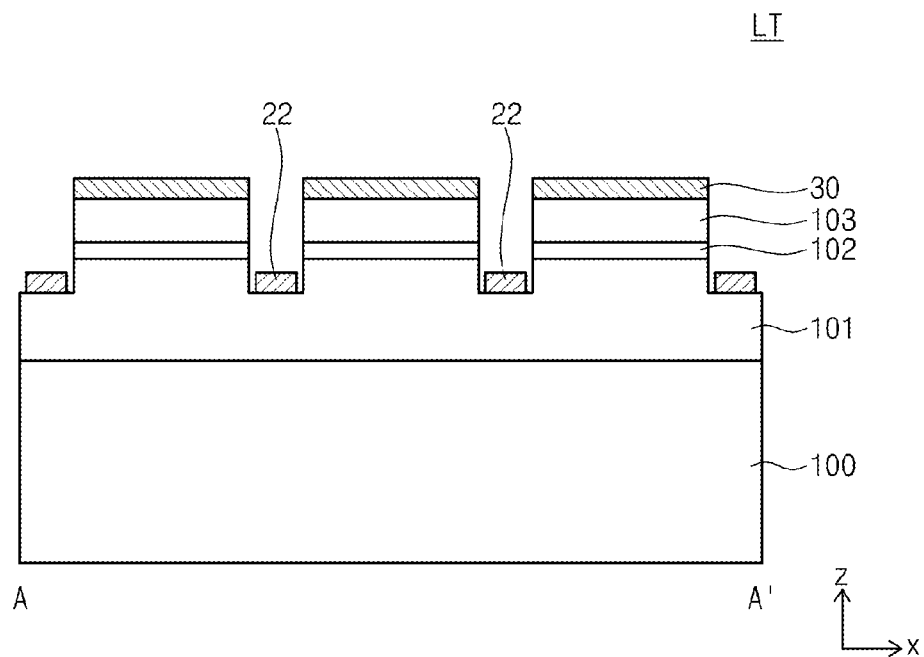
FIG. 2 is a cross-sectional view taken along a line A-A' of FIG. 1.

FIG. 1 is a plan view illustrating a light emitting diode LT according to some embodiments of the inventive concept. FIG. 2 is a cross-sectional view taken along a line A-A' of FIG. 1.

Referring to FIGS. 1 and 2, a first semiconductor layer 101 may be provided on a transparent substrate 100. The transparent substrate 100 may include an oxide having a lattice constant close to a lattice constant of a nitride semiconductor such as GaN. In an embodiment, the transparent substrate 100 may be a sapphire substrate. The first semiconductor layer 101 may include a semiconductor layer doped with n-type dopants. In an embodiment, the first semiconductor layer 101 may include a first layer and a second layer. The first layer may be disposed between the second layer and the transparent substrate 100. The first layer may be an undoped gallium nitride (undoped-GaN) layer (hereinafter, referred to as 'a u-GaN layer'). The second layer may be a semiconductor layer doped with n-type dopants (e.g., an n-GaN layer). According to some embodiments of the inventive concept, the u-GaN layer may be formed to have a thickness of about 2 μm to about 3 μm. The second layer may be formed by an epitaxial process using the first layer as a seed layer. The first semiconductor layer 101 may be formed by a metal organic chemical vapor deposition (MOCVD) process and/or a vapor-phase epitaxy (VPE) process.

An active layer 102 may be provided on the first semiconductor layer 101. The active layer 120 may be a light emitting layer. In an embodiment, the active layer 102 may include a first quantum well layer and a second quantum well layer. The active layer 102 may further include barrier layers constituting barriers of quantum wells of the first and second quantum well layers. The first quantum well layer, the second quantum well layer, and the barrier layers may be indium-gallium nitride ($In_xGa_{1-x}N$, $0 \leq x < 1$) layers of which composition ratios are different from each other.

The active layer 120 may be formed by a MOCVD process and/or a VPE process.

A second semiconductor layer 103 may be formed on the active layer 102. The second semiconductor layer 103 may be a semiconductor layer having a conductivity type of a p-type (e.g., a p-GaN layer). According to some embodiments of the inventive concept, the second semiconductor layer 103 may be a GaN layer doped with magnesium (i.e., a Mg-doped GaN layer). The second semiconductor layer 103 may be formed by a MOCVD process and/or a VPE process.

A first electrode 20 may be provided on the first semiconductor layer 101, and a second electrode 30 may be provided on the second semiconductor layer 103. The first electrode 20 may be formed on a surface of the first semiconductor layer 101 exposed by patterning the second semiconductor layer 103 and the active layer 102. In this case, an upper portion of the first semiconductor layer 101 may also be removed. The second electrode 30 may be formed on a surface of the second semiconductor layer 103. The first and second electrodes 20 and 30 may be formed of the same material. The first and second electrodes 20 and 30 may include a material capable of reflecting light generated from the active layer 102 toward the transparent substrate 100. In an embodiment, the first and second electrodes 20 and 30 may include a metal material such as aluminum and/or copper. The first and second electrodes 20 and 30 may be formed by a lift-off process or a patterning process.

The first electrode 20 may include an edge electrode 21 and a line electrode 22. The edge electrode 21 may have a closed loop-shape extending along an edge of light emitting diode, and the line electrode 22 may extend from the edge electrode 21. The line electrode 22 may include pad portions 23 adjacent to the edge electrode 21. When the light emitting diode is mounted on a package substrate, bumps may be disposed on the pad portions 23. Thus, the pad portion 23 may have a width greater than those of the edge and line electrodes 21 and 22.

The edge electrode 21 may include a first edge portion E1 and a second edge portion E2 opposite to each other. The line electrode 22 may include a first line portion L1 extending from the first edge portion E1 and a second line portion L2 extending from the second edge portion E2. The first line portion L1 and the second line portion L2 may be parallel to each other.

The edge electrode 21 may further include a third edge portion E3 and a fourth edge portion E4. The third and fourth edge portions E3 and E4 may connect the first and second edge portions E1 and E2 to each other. The third and fourth edge portions E3 and E4 may be parallel to each other. The first and second line portions L1 and L2 may be parallel to the third and fourth edge portions E3 and E4.

Each of the line electrodes 22 including the line portions L1 and L2 may have a first end portion spaced apart from the edge electrode 21 and a second end portion connected to the edge electrode 21. In an example, the first line portion L1 may be spaced apart from the second edge portion E2, and the second line portion L2 may be spaced apart from the first edge portion E1. In other words, the line electrode 22 may be connected to one of the edge portions E1 and E2 opposite to each other but may be spaced apart from the other of the opposite edge portions E1 and E2. A distance d between the line electrode 22 and the edge portion E1 or E2 spaced apart therefrom may be equal to or less than a quarter of a length L of the line electrode 22. In an example, a distance d between the first line portion L1 and the second edge portion E2 may be equal to or less than a quarter of a length L of the first line portion L1. In the present specification, the length of the line electrode 22 corresponds to a length including the pad portion 23. In other words, each of the first and second line portions L1 and L2 may include the pad portion 23. In a plan view, the second electrode 30 may be formed in a region where the first electrode 20 is not disposed, as illustrated in FIG. 1. The second electrode 30 may reflect the light emitted from the active layer 102 toward the transparent substrate 100.

An arrangement form of the first electrode 20 may determine a current density distribution in the light emitting diode, and a luminous efficiency of the light emitting diode may be varied depending on the arrangement form of the first electrode 20. In an embodiment, a current may be uniformly distributed in the light emitting diode due to the edge electrode 21 having the closed loop-shape along the edge of the first semiconductor layer 101 and the line electrode 22 extending from the edge electrode 21. Thus, a current diffusion of the light emitting diode may be improved to increase the luminous efficiency of the light emitting diode.

If the distance d between an end portion of the line electrode 22 and the edge electrode 21 is greater than the quarter of the length L of the line electrode 22, a current by the first electrode 20 may not be smoothly supplied in a space between the line electrode 22 and the edge electrode 21, such that the luminous efficiency may be reduced. According to embodiments of the inventive concept, the distance d between the end portion of the line electrode 22 and the edge electrode 21 is controlled to be equal to or less than the quarter of the length L of the line electrode 22, such that the luminous efficiency of the light emitting diode LT may be improved.

Figure 3:
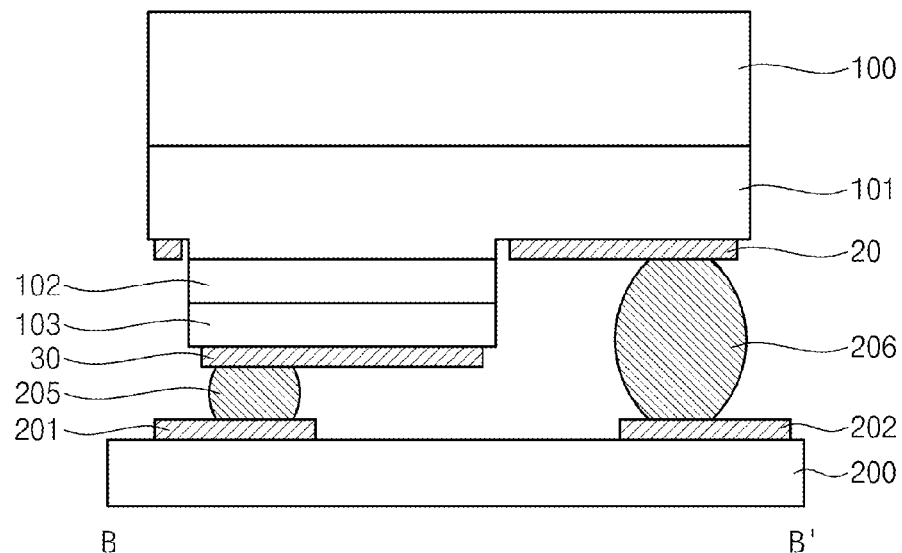
FIG. 3 is a cross-sectional view taken along a line B-B' of FIG. 1 to illustrate a light emitting diode mounted on a package substrate according to some embodiments of the inventive concept.

FIG. 3 is a cross-sectional view taken along a line B-B' of FIG. 1 to illustrate a light emitting diode LT mounted on a package substrate according to some embodiments of the inventive concept.

Referring to FIG. 3, the light emitting diode LT according to some embodiments may be mounted on a package substrate 200 by a flip chip bonding technique so that the first and second electrodes 20 and 30 face a top surface of the package substrate 200. The package substrate 200 may be a printed circuit board (PCB) or a semiconductor substrate. A first pad 201 and a second pad 202 may be disposed on the top surface of the package substrate 200. A first bump 205 and a second bump 206 may be disposed on the first pad 201 and the second pad 202, respectively. The first electrode 20 may be connected to the package substrate 200 through the second bump 206 and the second pad 202. The second electrode 30 may be connected to the package substrate 200 through the first bump 205 and the first pad 201.

Figure 4:
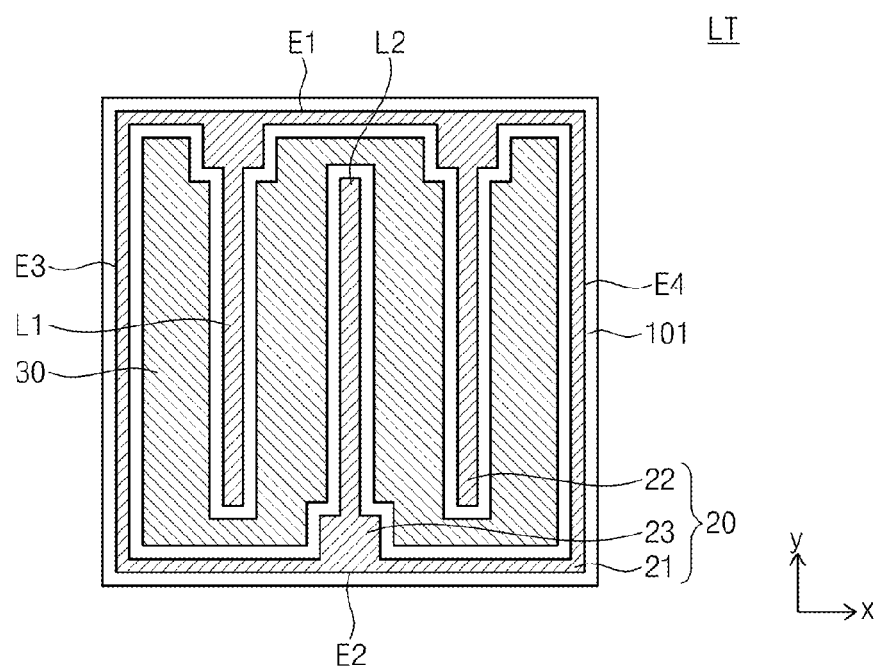
FIGS. 4 to 6 are plan views illustrating light emitting diodes according to other embodiments of the inventive concept.
Figure 5:
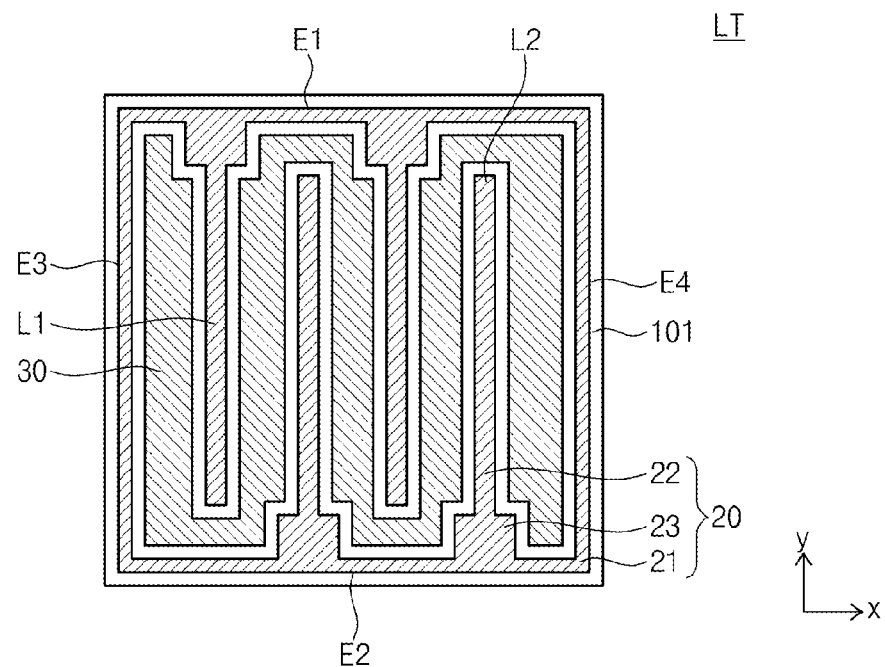
Figure 6:
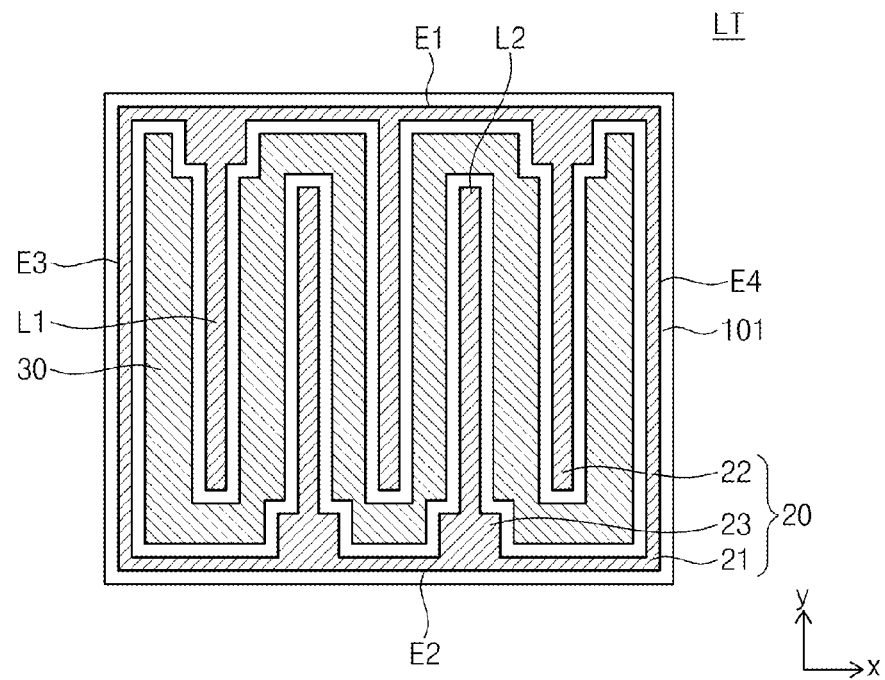

FIGS. 4 to 6 are plan views illustrating light emitting diodes according to other embodiments of the inventive concept. For the purpose of ease and convenience in explanation, the descriptions to the same elements as described in the aforementioned embodiments will be omitted or mentioned briefly.

Referring to FIGS. 4 to 6, at least one of the first line portion L1 and the second line portion L2 may be provided in a plural number. In other words, the first line portion L1 extending the first edge portion E1 may include a plurality of first line portions L1 and/or the second line portion L2 extending from the second edge portion E2 may include a plurality of second line portions L2. For example, three line electrodes 22, four line electrodes 22, and five line electrodes 22 may be illustrated in FIGS. 3, 4, and 5, respectively. However, the inventive concept is not limited thereto. The line portion L1 and the second line portion L2 may be alternately arranged in an x-direction. Each of the line electrodes 22 may have a first end portion spaced apart from the edge electrode 21 and a second end portion connected to the edge electrode 21. Some of the line electrode 22 may include pad portions 23 adjacent to the edge electrode 21.

Figure 7:
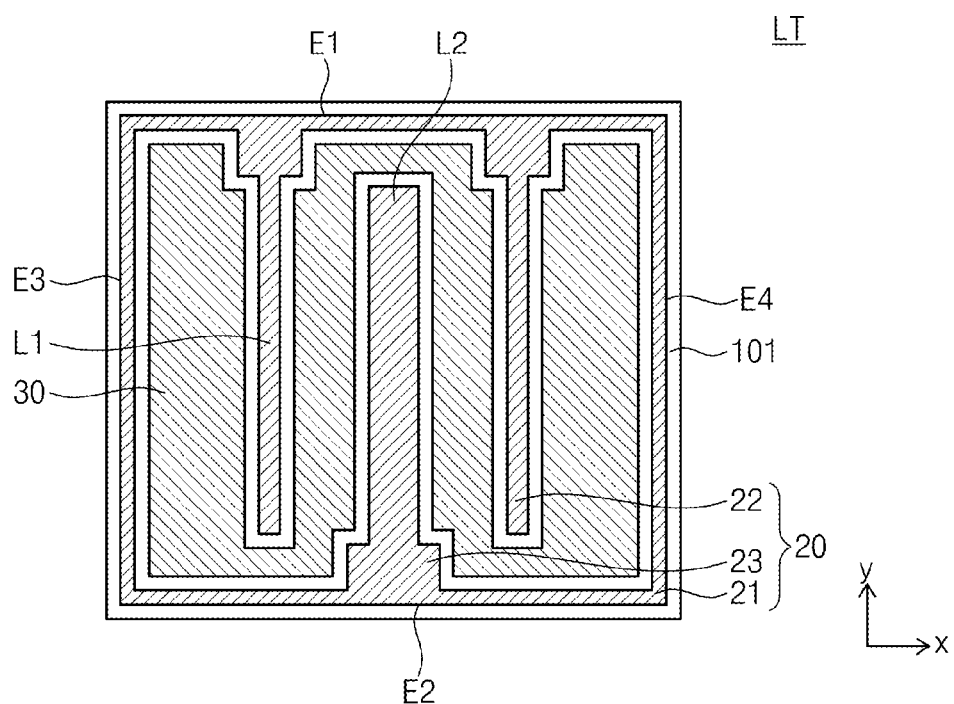
FIG. 7 is a plan view illustrating a light emitting diode according to still other embodiments of the inventive concept.

FIG. 7 is a plan view illustrating a light emitting diode according to still other embodiments of the inventive concept. For the purpose of ease and convenience in explanation, the descriptions to the same elements as described in the aforementioned embodiments will be omitted or mentioned briefly.

In the present embodiment, the second line portion L2 extending from the second edge portion E2 is disposed at an equal distance from the third and fourth edge portions E3 and E4, and a plurality of the first line portions L1, e.g., two first line portions as shown in FIG. 7, extend from the first edge portion E1. A width of the second line portion L2 may be greater than a width of each of the first line portions L1. Additionally, the width of the second line portion L2 may be greater than a width of the edge electrode 21. Since the second line portion L2 may be disposed at a center of the light emitting diode LT as compared with the first line portions L1, the width of the second line portion L2 may be widened to improve the current diffusion of the light emitting diode LT. Additionally, the first line portions L1 and the edge electrode 21 may be narrowed except the second line portion L2, such that an total occupied area of the first electrode 20, i.e., the total area occupied by the edge electrode 21, the first line portions L1, the second line portion L2, and the pad portions 23, may be reduced. If the light emitting diode LT is mounted in the form of the flip chip as illustrated in FIG. 3, an occupied area of the active layer 102 may be reduced as the occupied area of the first electrode 20 increases. However, according to the present embodiment, the total occupied area of the first electrode 20 may be reduced to improve the luminous efficiency of the light emitting diode.

According to embodiments of the inventive concept, the current diffusion characteristic of the light emitting diode may be improved to increase the luminous efficiency of the light emitting diode.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A light emitting diode comprising:
a substrate;
a first semiconductor layer, an active layer, and a second semiconductor layer sequentially stacked on the substrate; and
a first electrode connected to the first semiconductor layer,
wherein the first electrode comprises:
an edge electrode having a closed loop-shape extending along a periphery of the first semiconductor layer, the edge electrode including a first edge portion and a second edge portion opposite to each other; and
a plurality of first line portions extending from the first edge portion and a second line portion extending from the second edge portion;
wherein a distance of each of the first line portions from the second edge portion is equal to or less than a quarter of a length of each of the first line portions,
wherein a distance between the second line portion and the first edge portion is equal to or less than a quarter of a length of the second line portion,
wherein each of the plurality of first line portions includes a separate pad portion adjacent to the edge electrode, and the second line portion includes a pad portion adjacent to the edge electrode,
wherein the second line portion extends in a lengthwise direction from the pad portion of the second line portion, the width of the second line portion is maintained to be greater than the width of each first line portion extending in the lengthwise direction from the pad portion of said each first line portion and the width of the second line portion is greater than a width of the edge electrode, and an area occupied by the second line portion is greater than an area occupied by each first line portion.

2. The light emitting diode of claim 1, wherein each of the first line portions is parallel to the second line portion.

3. The light emitting diode of claim 1, wherein the edge electrode further comprises: a third edge portion and a fourth edge portion that connect the first edge portion to the second edge portion; and
wherein the third edge portion is parallel to the fourth edge portion.

4. The light emitting diode of claim 3, wherein the first line portions and the second line portions are parallel to the third and fourth edge portions.

5. The light emitting diode of claim 4, wherein a distance between the second line portion and the third edge portion is substantially equal to a distance between the second line portion and the fourth edge portion.

6. The light emitting diode of claim 1, further comprising:
a second electrode connected to the second semiconductor layer.

7. A light emitting diode package comprising:
a package substrate;
a second semiconductor layer, an active layer, a first semiconductor layer, and a transparent substrate sequentially stacked on the package substrate;
a first electrode connected to the first semiconductor layer;
a second electrode connected to the second semiconductor layer; and
bumps connecting the first and second electrodes to the package substrate,
wherein the first electrode comprises:
an edge electrode having a closed loop-shape extending along a periphery of the first semiconductor layer, the edge electrode including a first edge portion and a second edge portion opposite to each other; and
a plurality of first line portions extending from the first edge portion and a second line portion extending from the second edge portion;
wherein a distance of each of the first line portions from the second edge portion is equal to or less than a quarter of a length of each of the first line portions,
wherein a distance between the second line portion and the first edge portion is equal to or less than a quarter of a length of the second line portion,
wherein each of the plurality of first line portions includes a separate pad portion adjacent to the edge electrode, and the second line portion includes a pad portion adjacent to the edge electrode,
wherein the second line portion extends in a lengthwise direction from the pad portion of the second line portion, the width of the second line portion is maintained to be greater than the width of each first line portion extending in the lengthwise direction from the pad portion of said each first line portion and the width of the second line portion is greater than a width of the edge electrode, and an area occupied by the second line portion is greater than an area occupied by each first line portion.

8. The light emitting diode package of claim 7, wherein each of the first line portions is parallel to the second line portion.

9. The light emitting diode package of claim 7, wherein the edge electrode further comprises: a third edge portion and a fourth edge portion that connect the first edge portion to the second edge portion; and wherein the third edge portion is parallel to the fourth edge portion.

10. The light emitting diode package of claim 9, wherein a distance between the second line portion and the third edge portion is substantially equal to a distance between the second line portion and the fourth edge portion.

* * * * *